United States Patent [19]

Kraybill

[11] 4,042,952
[45] Aug. 16, 1977

[54] R. F. POWER TRANSISTOR DEVICE WITH CONTROLLED COMMON LEAD INDUCTANCE

[75] Inventor: Albert Victor Kraybill, Arlington Heights, Ill.

[73] Assignee: Motorola, Inc., Schaumburg, Ill.

[21] Appl. No.: 694,252

[22] Filed: June 9, 1976

[51] Int. Cl.² ............... H01L 23/48; H01L 27/02; H01L 39/02
[52] U.S. Cl. .................................. 357/68; 357/51; 357/80
[58] Field of Search ................... 357/80, 68, 51

[56] References Cited

U.S. PATENT DOCUMENTS

| 3,590,341 | 6/1971 | Preston | 357/80 |
| 3,908,185 | 9/1975 | Martin | 357/80 |

Primary Examiner—Edward J. Wojciechowicz
Attorney, Agent, or Firm—Victor Myer; James W. Gillman

[57] ABSTRACT

An R. F. power transistor device is disclosed wherein the common lead inductance may be controlled to any desired value from zero to relatively high values.

The transistor device includes an insulating member of beryllium oxide to one side of which there may be bonded the usual metal heat sink. On the other side of the beryllium oxide member there are metallized areas to which the input and output ground conductors are bonded, the input lead is bonded, the output lead is bonded and the collector of the transistor chip is bonded. One plate of an MOS capacitor is bonded to the input ground lead. In the case of grounded emitter applications, short, small wires are connected from the emitter areas of the transistor in each direction to the input ground leads and the output ground leads respectively. The base areas of the transistor are connected by short, small wire leads to the other plate areas of the MOS capacitor and to the input lead. The metallizations to which the input ground leads and output ground leads are bonded and the input and output ground leads are separated by gaps. This has the result of reducing the common lead inductance to as near zero as possible. One or more short, small wire leads are jumpered across the gap to give an added, but controlled, amount of inductance. On each side of the gap the ends of the input and output ground leads may have lateral extensions to which the jumper leads are connected at a particular lateral locations to give the desired inductance.

11 Claims, 5 Drawing Figures

R. F. POWER TRANSISTOR DEVICE WITH CONTROLLED COMMON LEAD INDUCTANCE

BACKGROUND OF THE INVENTION

Present day R. F. power transistor devices contain an uncontrolled, and usually too large, amount of common lead inductance. When transistors are intended for use in the ultra high frequency ranges for example from 400 MHz to two or more gigahertz, the inductance of the leads, usually formed by very small wires extending from the transistor emitter or base to ground, or input, leads and output leads becomes very significant. In such transistor devices, a capacitor which may be of the MOS variety is usually mounted in close association with the transistor chip and one or more of the small wire interconnecting leads extend from the transistor chip to the MOS capacitor and to the input or output leads. The capacitor works in conjunction with the inductance of the various leads in order to provide the desired impedance matching and the like. Inductances in the ranges of nanohenries and even picohenries are values to be reckoned with.

Typical of the prior art is the patent to Litty et al No. 3,713,006 dated Jan. 23, 1973. As shown in Litty, at least in one form of high frequency transistor, the ground conductors are relatively large area leads as are the input and output conductors. The transistor chip has subdivided base and emitter areas from which small wire conductors extend to the appropriate leads. In addition, an MOS capacitor which may have subdivided portions is mounted on the same substrate and small wire leads extend from the subdivided contacts of the capacitor plates to the appropriate other components.

In these prior art high frequency power transistors making the small wire leads as short as possible, placing them in parallel where possible, and having them extend in opposite directions all tend to reduce the common lead inductance. Nevertheless there is, in the prior art devices, always some inductance remaining and usually too large an amount. Moreover it is not easily controllable, if at all.

Also in the prior art transistors, metallized areas are provided on an electrically insulating but thermally conducting layer made, for example, of beryllium oxide and the various components including the ground leads, input leads, output leads, transistor chip and capacitor chip are bonded to the appropriate ones of the metallized areas. The opposite side of the beryllium oxide member is bonded usually to a large metal heat sink while the ground leads in such devices are connected to the appropriate metallization. It is nevertheless difficult to determine where actual ground occurs in the case of the transistors functioning in the high MHz and gigahertz regions. This, of course, further complicates the design problem of determining what actually is the common lead inductance and controlling it.

SUMMARY OF THE INVENTION

It is an object of the invention to provide an improved R. F. power transistor device with controlled common lead inductance.

It is a further object of the invention to provide such an improved R. F. power transistor device wherein it is feasible to build-in any desired value of common lead inductance from zero up.

In carrying out the invention according to one form, there is provided in a high frequency transistor device including a transistor chip having emitter, base and collector areas, a relatively large area ground lead conductor and at least two short, small wire leads extending from one of the emitter and base areas to separate points on the ground lead conductor, means for controlling the inductance from the one of the emitter and base areas to the ground lead conductor comprising a gap in the ground lead conductor between the separate points. In carrying out the invention according to a further form there is provided a high frequency transistor device comprising a thermally conducting and electrically insulating supporting structure, metallized areas insulated from each other disposed on the supporting structure, a transistor chip having emitter areas, and base areas, and a collector bonded to one of the metallized areas, spaced apart and inner end connected large area input ground conductors bonded at the inner end to a second one of the metallized areas, spaced apart and inner end connected large area output ground conductors bonded at the inner end to a third one of the metallized areas, a large input conductor disposed between the spaced apart portions of the input ground conductors and bonded to a fourth one of the metallized areas, a large area output conductor disposed between the spaced apart portions of the output ground conductor and bonded to a fifth one of the metallized areas, a capacitor having a ground plate and a second plate, the ground plate of which is bonded to the inner end connection of the input ground conductors, short, small wire leads bonded to the emitter area and to the inner end connections of the input and output ground leads, short, small wire leads bonded to the base area and the second plate of the capacitor, short, small wire leads bonded to the second plate of the capacitor and to the input conductor, short, small wire leads bonded to the collector metallized area and the output conductor, the opposed ends of the input and output ground conductors adjacent the inner connected ends being spaced apart from each other and forming a gap between the opposed ends, and means for controlling the inductance of the leads connected to the emitter areas and the input and output ground conductors comprising one or more short, small wire leads extending across the gaps and bonded to the opposed ends of the inner and outer ground conductors. The number of short, small wire leads extending across the gaps which, of course, exist in the metallization areas as well as between the input ground and output ground conductors may be of any desired value from zero (low $L_{com}$) to any number (high $L_{com}$) in order to provide the desired value of common lead inductance.

DESCRIPTION OF THE PREFERRED EMBODIMENT

Figure 1:
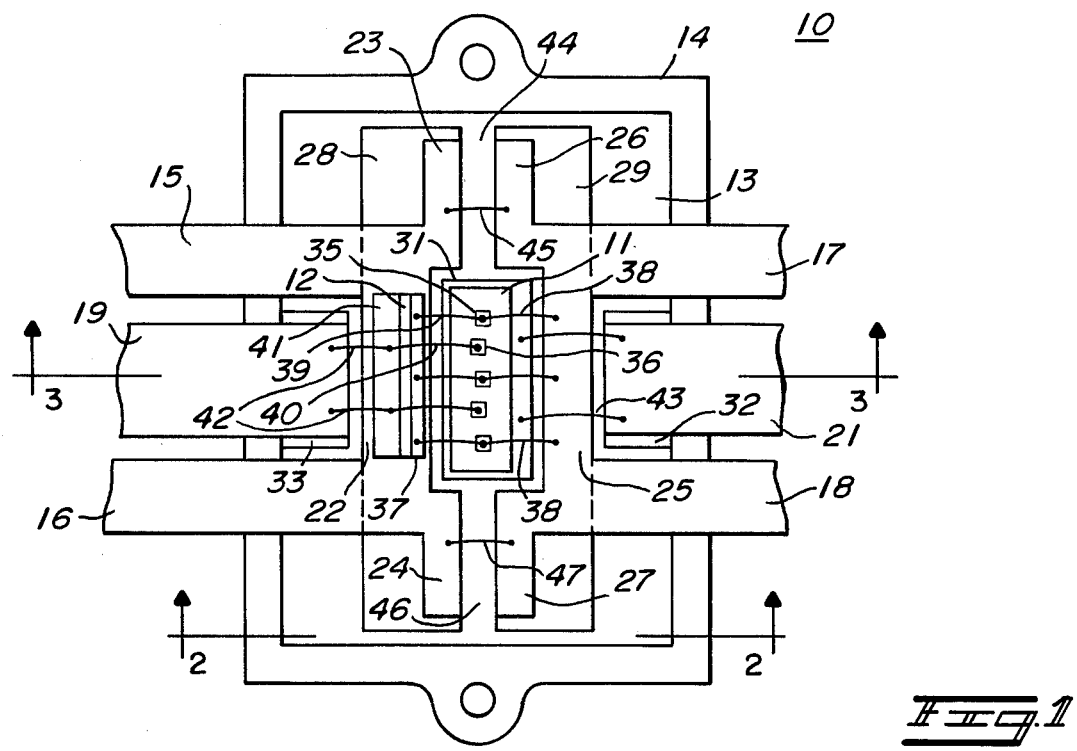
FIG. 1 is a top view of an R. F. power transistor device according to the invention.

Referring to the drawings there is shown an R. F. power transistor device 10 comprising a transistor chip 11 an MOS capacitor chip 12, an electrically insulating supporting layer 13, a metal heat sink 14, input ground leads 15 and 16, output ground leads 17 and 18, an input lead, or conductor, 19 and an output lead, or conductor, 21 together with various metallization layers on the insulating layer 13 and small wire interconnecting leads between various of the components as will be more particularly described.

The input ground conductors 15 and 16 are interconnected integrally by a part 22 and, extending laterally from each of the inner ends of input ground conductors 15 and 16 there are lateral extensions 23 and 24, respectively. Similarly the output ground conductors 17 and 18 are connected integrally at their inner ends by a part 25 and, extending laterally from the inner ends of the output ground conductors 17 and 18 there are lateral extensions 26 and 27, respectively.

Bonded to the upper surface of insulating layer 13 there are metallizations 28, 29, 31, 32 and 33 each of which is electrically insulated from the others. The interconnecting part 22 of the inner ends of input ground conductors 15 and 16 and the lateral extensions 23 and 24 are bonded to the metallization 28. The inner ends of output ground conductors 17 and 18, the interconnecting part 25 and the lateral extensions 26 and 27 are bonded to the metallization 29. The metallizations 28 and 29 conform in general to the shape of the input ground and output ground conductors to which they are bonded. The input conductor 19 is bonded to the metallization 33 and the output conductor 21 is bonded to the metallization 32. The transistor chip 11 includes emitter, base and collector parts of which the base and emitter may be subdivided into parts as is well understood in this art and it is not believed to require further elaboration. The collector 34 of the transistor is bonded to the metallization 31. In the common emitter form of circuitry, the emitter areas are represented by the emitter contacts 35 and the base areas are represented by the base contacts 36.

The MOS capacitor chip 12 is bonded through one of its plates 37 to the interconnecting part 22.

Small wire leads 38 and 39 extend from the emitter contacts 35 in opposite directions and are bonded to the interconnecting part 25 of output ground conductors 17 and 18 and to the bottom plate 37 of the MOS capacitor chip which is bonded to the interconnecting part 22 of the input ground conductors 15 and 16. The base contacts 36 are connected by means of small wire leads 40 to the contacts on the other plate 41 of the MOS capacitor chip 12. The same plate 41 of the MOS capacitor chip is connected by means of small wire leads 42 to the input end of input conductor 19. The collector 34 of the transistor chip 11 is connected by means of small wire leads 43 to the adjacent end of the output conductor 21.

Connected across the gap 44 between the extensions 23 and 26 and the metallizations 28 and 29 is a jumper conductor 45 of small fine wire. There may, as will become clear, be more than one jumper 45 in order to give the inductance value desired. Similarly, across the gap 46 between the extensions 24 and 27 and the metallizations 28 and 29 there is connected a conductor or jumper lead 47 which may be of small fine wire. There may be more than one of jumpers 47 in order to give the inductance value desired. The location of jumpers 45 and 47 along the extensions 23, 26, and 24, 27 may be disposed at any point from the outer extremity to the inner one, also, in order to give any desired value of inductance.

Figure 2:
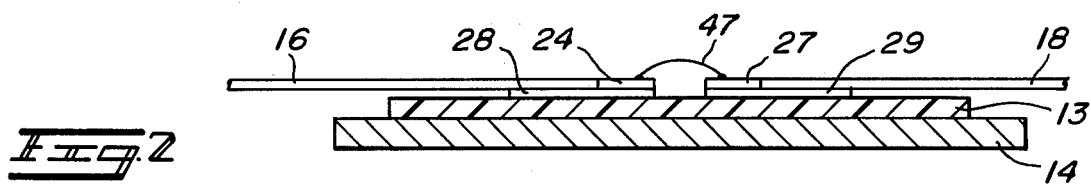
FIG. 2 is a cross-sectional view taken substantially in the direction of arrows 2—2 of FIG. 1.
Figure 3:
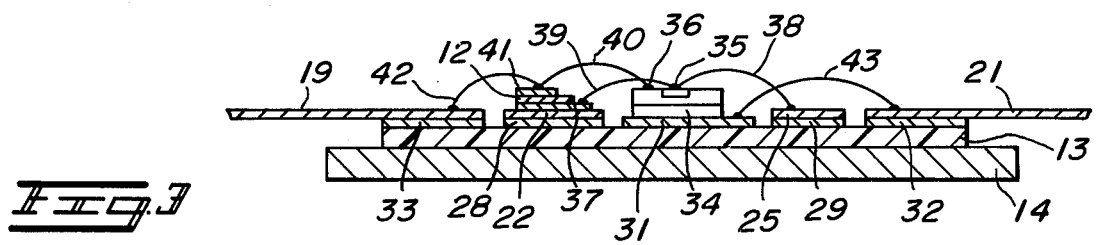
FIG. 3 is a cross-sectional view taken substantially in the direction of the arrows 3—3 of FIG. 1.
Figure 4:
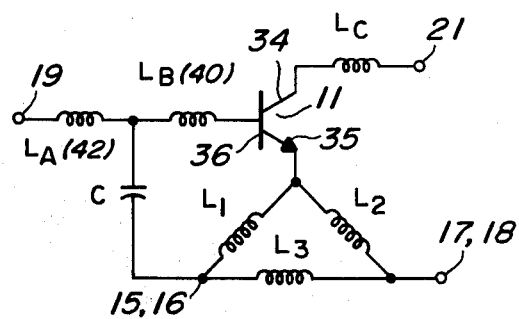
FIG. 4 is a circuit diagram representing the various components.

Reference should now be had to the circuit diagram of FIG. 4 in which the components as described in connection with FIGS. 1-3 are shown in the form of an electrical circuit. The circuit FIG. 4 shows the transistor chip 11 connected in the common emitter mode although this is by way of example only, the terminals (19, 21), (17, 18), and (15, 16) corresponding at least generally to the similarly numbered parts of FIG. 1. In FIG. 4, $L_A$ represents the inductance of leads 19 and 42, C represents the capacitance of MOS capacitor 12, $L_B$ represents the inductance of leads 40 to the base of the transistor, $L_C$ represents the inductance of the leads 21 and 43 between the collector 34 and the end of output conductor 21, $L_1$ represents the inductance of the leads 39 extending from the emitter of the transistor to the ground plate of MOS capacitor chip 12 and thus to the input ground leads 15 and 16, and $L_2$ represents the inductance of leads 38 extending from the emitter areas 35 to the interconnecting part 25 and thus to the output ground leads 17 and 18. $L_3$ represents the inductance of the jumpers 45 and 47 which are connected across the extensions 23, 26 and 24, 27 respectively. $L_3$ also represents the inductance of the extensions 23, 26 and 24, 27 and immediately associated paths.

While inductances $L_A$, $L_B$, $L_C$, $L_1$, $L_2$, and $L_3$ are specifically dealt with because of their significance to the invention, it will be clear that the conductors 15, 16, 17, 18, 19, and 21 have inductance which contributes to the total inductance present.

Figure 5:
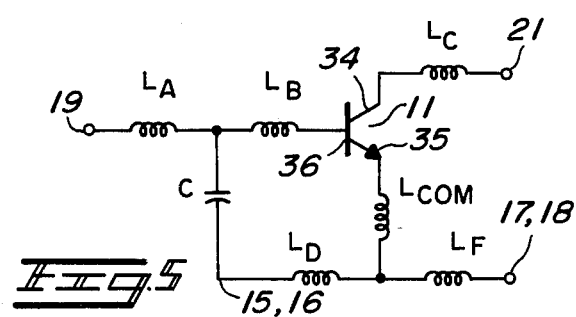
FIG. 5 is a circuit diagram similar to that of the FIG. 4 but in which the emitter inductances have been arranged in a T circuit as compared with a delta circuit.

$L_1$, $L_2$, and $L_3$, the inductances connecting the emitter of the transistor chip 12 to the input ground leads 15, 16 and the output ground leads 17, 18 form a delta network as shown. In FIG. 5 there is shown the same circuit diagram as in FIG. 4 but the inductances connected from the emitter 35 to the input ground leads 15, 16 and output ground leads 17, 18 have been transformed into a T network in which $L_{com}$ represents the common lead inductance and $L_D$ and $L_F$ represent the other two branches of the T network. In FIG. 5 the expression determining the magnitude of $L_{com}$ is $$L_{com} = (L_1 \times L_2)/(L_1 + L_2 + L_3).$$

As in the prior art, the subject invention according to one form uses split input ground conductors, or leads, 15 and 16 and output ground conductors, or leads, 17 and 18, but in prior art constructions these input and output ground conductors were connected together directly or through common metallizations. In other words, in known prior art constructions the extensions 23 and 26 would be connected together, the extensions 24 and 27 would be connected together, and the metallizations 28 and 29 would be in effect be one metallization. According to the invention, however, the gaps 44 and 46 are created by separating the metallizations 28 and 29 and the extensions 23, 26 and 24, 27. The desired inductance between input and output ground conductors 15 and 17 and input and output ground conductors 16 and 18 is achieved by one or more jumper conductors 45 and 47 across the gaps 44 and 46, respectively, by the extensions 23, 26 and 24, 27, and by the lateral location on the extensions of the jumper leads 45 and 47.

In the prior art the elimination of the gaps 44 and 46 in effect resulted in placing a minimum value of $L_3$ between the input ground conductors and the output ground conductors which increases $L_{com}$ and is the very effect that it is desired to eliminate.

Providing the gaps 44 and 46 without any jumper leads 45 and 47, open circuits $L_3$ or as close thereto as one can practically make it, realizing that at the frequencies involved current is going to flow in the external ground conductors at some point. Having no jumpers 45 and 47 while leaving $L_3$ open leaves $L_3$ uncontrolled, but having no gaps 44 and 47 achieves minimum $L_3$, also uncontrolled, and in fact the worst case. By utilizing the jumper leads 45 and 47 the value of $L_3$ can be determined and the value of the common lead inductance to the emitter 35 made any value desired from zero up to high values. A controlled value of common lead inductance is thus achieved as compared with the prior art where it was essentially indeterminant.

The gaps 44 and 47 need not be of any particular lengths so long as they are actual gaps and in fact they may be as short as possible so as not to increase the length of the jumper leads 45 and 47 unduly.

The capacitor C, (chip 12), may be selected to form an L section matching network. The results in reducing the Q value of the transistor device and thus increasing the band width. By providing the gaps 44 and 46 between the input and output ground metallizations and conductors and by utilizing the desired number of jumper leads or bonds 45 and 47 across the gaps 44 and 46, respectively, the values of the gain of the transistor, the Q and the band width may be optimized and controlled.

While a common emitter form of transistor device has been shown in the drawings and described the same principles apply to the common base form of device which which is within the scope of the invention.

Other advantages will be evident to those skilled in the art.

I claim:

1. In a high frequency transistor device including a transistor chip having emitter, base and collector areas, a relatively large area input ground lead conductor means, a relatively large area output ground lead conductor means and at least two short, small wire leads extending from one of said emitter and base areas to separate points on said input and output ground lead conductor means, means for controlling the common lead inductance from said one of said emitter and base areas to said input and output ground lead conductor means comprising a gap in said input and output ground lead conductor means between said separate points.

2. The high frequency transistor device according to claim 1 wherein the means for controlling said common lead inductance includes one or more short, small wire leads extending across said gap.

3. The high frequency transistor according to claim 2 wherein the large area lead conductors on each side of said gap include lateral extensions, and said one or more short, small wire leads extend across said gap to said extensions.

4. A high frequency transistor device comprising a thermally conducting and electrically insulating supporting structure, metallized areas insulated from each other disposed on said supporting structure, a transistor chip having emitter areas, base areas and a collector bonded to one of said metallized areas, spaced apart and inner end connected large area input ground conductors bonded at its inner end to a second metallized area, spaced apart and inner end connected large area output ground conductors bonded at its inner end to a third metallized area, a large area input conductor disposed between the spaced apart portions of said input ground conductors and bonded to a third one of said metallized areas, a large area output conductor disposed between the spaced apart portions of said output ground conductors and bonded to a fourth one of said metallized areas, a capacitor having a ground plate and a second plate, the ground plate of which is bonded to the inner end connection of said input ground conductors, short small wire leads of substantially equal length bonded to said emitter area and to the inner end connections of said input and said output ground leads, short, small wire leads bonded to said base area and said second plate of said capacitor, short, small wire leads bonded to said second plate of said capacitor and to said input conductor, short small wire leads bonded to the collector metallized area and said output conductor, the opposed ends of said input and output ground conductors adjacent the said inner connected ends being spaced apart from each other and forming a gap between the opposed ends, and means for controlling the inductance of said leads connected to said emitter areas and said input and output ground conductors comprising one or more short, small wire leads extending across said gaps and bonded to the opposed ends of said inner and outer ground conductors.

5. The high frequency transistor device according to claim 4 wherein the spaced apart inner ends of said input and output ground leads include extensions lateral to said ground leads, said gaps being disposed between said extensions, and said one or more short, small wire leads extend across said gaps to said extensions.

6. The high frequency transistor device according to claim 5 wherein there are four lateral extensions, one from each of input and output ground conductors.

7. The high frequency transistor package according to claim 6 wherein said four lateral extensions define two pairs of extensions of equal length.

8. The high frequency transistor device according to claim 6 wherein the lengths of said extensions is determined and the position of said leads across said gaps is determined to provide a predetermined value of common emitter lead inductance.

9. The high frequency transistor device according to claim 4 wherein the transistor chip includes several emitter areas, and a corresponding number of base areas, and said capacitor is an MOS capacitor.

10. In a high frequency semiconductive device having at least one active region, input conductor means, output conductor means, input ground lead conductor means, output ground lead conductor means and at least two short, small wire leads extending from said active region to separate points on said input and output ground lead conductor means, means for controlling the common lead inductance from said active area to said input and output ground lead conductor means comprising a gap in said input and output ground lead conductor means between said separate points.

11. The high frequency semiconductive device according to claim 10 wherein the means for controlling said common lead inductance includes one or more short, small wire leads extending across said gaps.

* * * * *